(12) United States Patent
Karchmer et al.

(10) Patent No.: US 6,173,245 B1
(45) Date of Patent: Jan. 9, 2001

(54) PROGRAMMABLE LOGIC ARRAY DEVICE DESIGN USING PARAMETERIZED LOGIC MODULES

(75) Inventors: David Karchmer, Sunnyvale; Scott D. Redman, Fremont; Jeffrey Chen, Santa Clara; James Schleicher, Sunnyvale, all of CA (US)

(73) Assignee: Altera Corporation, San Jose, CA (US)

( * ) Notice: Under 35 U.S.C. 154(b), the term of this patent shall be extended for 0 days.

(21) Appl. No.: 08/544,866

(22) Filed: Oct. 18, 1995

(51) Int. Cl.[7] ................................................... G06F 17/50
(52) U.S. Cl. ................................. 703/22; 703/20; 716/3; 716/17
(58) Field of Search ..................................... 395/500, 600, 395/611, 612, 602, 614; 364/488, 489; 307/465; 326/39–45; 703/22, 20, 1; 716/3, 17, 18

(56) References Cited

U.S. PATENT DOCUMENTS

| | | | |
|---|---|---|---|
| 4,871,930 | 10/1989 | Wong et al. | 307/465 |
| 4,964,056 | * 10/1990 | Bekki et al. | 364/488 |
| 5,260,611 | 11/1993 | Cliff et al. | 307/465 |
| 5,301,318 | * 4/1994 | Mittal | 395/600 |
| 5,396,435 | * 3/1995 | Ginetti | 364/489 |
| 5,446,675 | 8/1995 | Yoshimura | 364/489 |
| 5,452,226 | * 9/1995 | Hooper et al. | 364/489 |
| 5,473,546 | * 12/1995 | Filseth | 364/489 |
| 5,612,631 | * 3/1997 | Agrawal et al. | 326/39 |
| 5,841,663 | * 11/1998 | Sharma et al. | 364/490 |

FOREIGN PATENT DOCUMENTS

| | | | |
|---|---|---|---|
| WO 92/04684 | 3/1992 | (WO) | G06F/15/60 |
| WO 95/34868 | 12/1995 | (WO) | G06F/17/50 |

OTHER PUBLICATIONS

*Max+Plus II Programmable Logic Development System; Getting Started*, Version 5.0, Altera Corporation, San Jose, CA, Jul. 1994.
*Max+Plus II Programmable Lpgic Development System; AHDL*, Version 5.0, Altera Corporation, San Jose, CA, Jul. 1994.

* cited by examiner

*Primary Examiner*—Kevin J. Teska
*Assistant Examiner*—Thai Phan
(74) *Attorney, Agent, or Firm*—Fish & Neave; Robert R. Jackson; Michael E. Shanahan

(57) ABSTRACT

The design of logic for implementation in programmable logic array integrated circuit devices is facilitated by allowing various characteristics of modules in the logic design to be parameterized. Specific values for a parameter can be "inherited" by a logic module from other logic higher in the hierarchy of the logic design. Default values for parameters can also be provided. The user can design his or her own parameterized modules, and logic designs can be recursive, meaning that a logic module can make use of other instances of itself.

17 Claims, 14 Drawing Sheets

PARAMETERS X=A0, Y=B0, Z

FIG. 1a

FROM FIRST T2 INST.
X=A1, Y=B2, Z=?

SECOND INSTANCE
X=A0, Y=B0, Z=C1

```
MAX+PLUS II 6.0  FILE: RECURSIVE_AND.TDF

INCLUDE "RECURSIVE_AND.INC";

PARAMETERS
(
    WIDTH=8
);
SUBDESIGN RECURSIVE_AND
(
    i[(WIDTH-1)..0] : INPUT;
    o               : OUTPUT;
)
BEGIN
    IF WIDTH==1 GENERATE
        o = i[0];
    ELSE GENERATE
        o = i[0] & RECURSIVE_AND(i[(WIDTH-1)..1])
                WITH (WIDTH=WIDTH-1);
    END GENERATE
END
```

PROGRAMMABLE LOGIC ARRAY DEVICE DESIGN USING PARAMETERIZED LOGIC MODULES

BACKGROUND OF THE INVENTION

This invention relates to programmable logic array integrated circuit devices, and more particularly to the design of logic for implementation in such devices.

Programmable logic array integrated circuit devices are well known as shown, for example, by Wong et al. U.S. Pat. No. 4,871,930, Cliff et al. U.S. Pat. No. 5,260,611, and commonly assigned, co-pending U.S. patent application Ser. No. 08/442,795, filed May 17, 1995, all of which are hereby incorporated by reference herein. Such devices typically include a large number of relatively small logic modules, each of which is programmable to perform any of several logic functions on signals applied to that logic module. The modules are interconnectable in various ways by a programmable network of interconnection conductors so that the relatively simple logic functions performed by the individual logic modules can be concatenated into much more complex logic functions.

Computer programs are well known for assisting a user of a programmable logic device in implementing a desired logic design in the device. An example of such a computer program is the MAX+PLUS II Programmable Logic Development System, which is commercially available from Altera Corporation of San Jose, Calif. The MAX+PLUS II system is described, for example, in the Altera publications "MAX+PLUS II Getting Started", Version 5.0, July 1994, and "MAX+PLUS II AHDL", Version 5.0, July 1994, both of which are hereby incorporated by reference herein. The MAX+PLUS II system allows the user to specify the desired logic on a computer (e.g., an IBM-compatible personal computer with an Intel 486 microprocessor and adequate memory) using any of several different logic description interfaces. For example, there are text-based interfaces such as the Altera Hardware Description Language ("AHDL"), and there are graphics-based interfaces such as the MAX+PLUS II Graphic Editor. These interfaces allow the user to specify the desired logic in generic terms that are relatively standard for logic design and convenient for the user. They are not specific to the characteristics of the particular programmable logic device to be used.

Once the user has specified the desired logic design, computer programs such as the MAX+PLUS II system automatically convert that design to the form required for implementation on a particular programmable logic device. This typically involves reducing the user's logic design to relatively small pieces of logic (e.g., individual gates and flip-flops) that can be implemented in the logic modules of the device, and identifying the connections through the interconnection conductor network that are needed to interconnect the modules in the way required to produce the user's logic design. This process is sometimes referred to as "compilation" of the user's logic design. The computer program may then go on to control a device programmer to actually program the device (i.e., by programming the logic modules of the device to perform the various pieces of logic mentioned in the preceding sentence, and by programming the interconnection conductor network of the device to make the necessary connections between the logic modules).

As programmable logic devices have become larger (not necessarily in the physical sense but in the sense of increased logic capacity) and therefore capable of implementing more complex logic designs, a need has developed for more sophisticated user logic design and implementation tools. For example, an industry-standard "Library of Parameterized Modules" (LPM) has been developed in which various types of logic components are generalized in terms of one or more variables or "parameters." Thus a counter may be described generally using a parameter for its ultimate capacity, rather having different specifications for counters of different capacity (e.g., 2-bit, 4-bit, 6-bit, 8-bit, etc., capacity). Another parameter for a counter may indicate whether it counts up or down. An AND gate or multiplexer may be generalized using a parameter for its number of inputs. Parameterizing logic modules helps a logic designer in a number of ways, e.g., by facilitating re-use in different contexts of logic that the designer has already designed or that is otherwise extent. It would therefore be desirable for computer programs such as the MAX+PLUS II system to be able to support such parameterization.

In view of the foregoing, it is an object of this invention to provide improved methods for designing or specifying logic to be implemented in a programmable logic device.

It is a more particular object of this invention to provide programmable logic device logic implementation methods which allow the user to specify the desired logic design at least partly in terms of parameterized logic modules.

SUMMARY OF THE INVENTION

These and other objects of the invention are accomplished in accordance with the principles of the invention by providing programmable logic device logic implementation methods which allow the user to specify the desired logic in parameterized terms. Preferably the methods of this invention permit specific values to be assigned to each parameter in any of several different ways (e.g., "globally" (covering all instances of a logic module unless superseded as described below), "sub-globally" (covering all instances of a logic module from a particular instance of the module down through the remainder of all dependent branches in the hierarchy of the logic design, again unless superseded by a further sub-global parameter specification), or "by default"). Associated with this feature, the methods of this invention preferably follow particular rules for the selective "inheritance" of specific values for parameters from module to module as one moves down through the hierarchy of the logic design. For example, a specific value for a logic module parameter specified sub-globally at any point in the hierarchy of the logic design is inherited by all logic module instances in the hierarchy below the point at which that value is specified, unless that inheritance is cut off at some point by sub-globally setting another specific value for that parameter. Global values are inherited by all logic module instances in the design unless that inheritance is cut off by a sub-global specification of a different parameter value. Default values are used only in an instance of the logic module in which they are specified, if those parameters are otherwise unspecified globally or sub-globally in the hierarchy above that logic module instance. Default values are not passed on to other logic modules by inheritance.

During processing of the data for a user's logic design in accordance with this invention the specific values associated with each parameter of a parameterized logic module are preferably not associated with any instance of the logic module until relatively late in the process. For example, not until compilation of a particular instance of a logic module are the particular parameter values to be used for that instance of that module determined and used in the compilation process. Prior to such compilation, the data for each instance of a parameterized logic module is kept in general ("parameterized") form. This facilitates manipulation of the parameterized modules, identification of module instances that are either identical to other instances (because all the parameter values are the same) or different from one another (because one or more parameter values are different), etc. When multiple instances of a parameterized logic module are thus found to be identical, the compilation process can be significantly shortened because data from an earlier compilation of the module can simply be copied. Moreover, in doing such copying, it does not matter that the copied data includes parameterized sub-modules that may ultimately turn out to have different parameter values in different instances. This is so because, as mentioned above, the sub-module parameter information is still general at this stage. Only later, during compilation of each sub-module instance, are the sub-module parameter values particularized, and only then do possible differences between sub-module instances emerge.

The methods of this invention permit and facilitate the design of logic using recursion. This means that a parameterized logic module may employ instances of itself, albeit usually with different parameter values. The logic design interface may be provided with new constructs to facilitate such recursive logic design.

Further features of the invention, its nature and various advantages will be more apparent from the accompanying drawings and the following detailed description of the preferred embodiments.

BRIEF DESCRIPTION OF THE DRAWINGS

FIGS. 1a–1d show an illustrative user's logic design as it might be represented (at least primarily) using a logic design graphic interface. In other words, FIGS. 1a–1d show a user's logic design as the user might have designed it on a computer relying at least primarily on a logic design graphic interface like the Graphic Editor in the above mentioned MAX+PLUS II system.

FIG. 6 shows another illustrative user's logic design as it might be represented using a text-based logic design interface. FIG. 6 illustrates the use of recursion in logic design in accordance with this invention.

DETAILED DESCRIPTION OF THE PREFERRED EMBODIMENTS

FIGS. 1a–1d show a sample of a user's logic design which will be used herein as a vehicle for explaining various aspects of the present invention. The logic design shown in FIGS. 1a–1d is not meant to perform any actual useful logic. It has been structured principally to illustrate various characteristics and capabilities of an illustrative embodiment of the invention.

Figure 1A:
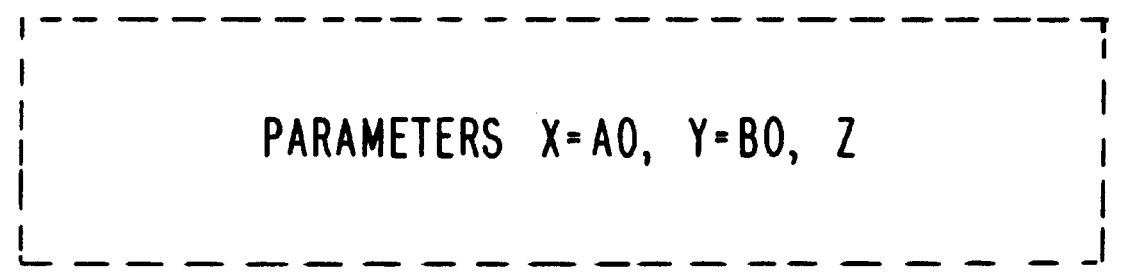
Figure 1B:
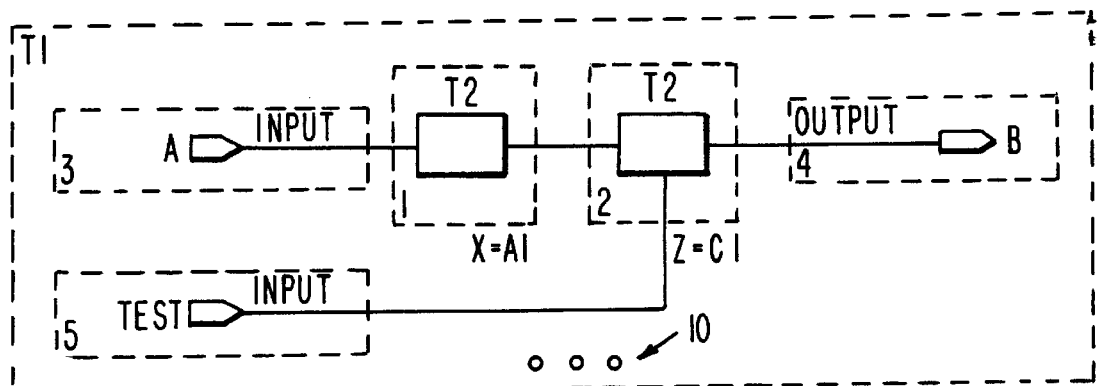

As part of the logic design of FIGS. 1a–1d the user has specified in FIG. 1a that the design uses several parameters, i.e., X, Y, and Z. These parameters may specify such properties as the width of a flip-flop register (i.e., the number of flip-flops in parallel in the register), the width of a logic gate (e.g., the number of inputs to an AND gate), the type of a counter (e.g., whether it is an up counter, a down counter, a binary counter, a binary coded decimal counter, etc.), or any other property that may be suitable for parameterization. The parameters may be a standard set of parameters (e.g., for logic modules in an industry-standard set such as the above-mentioned "Library of Parameterized Modules"), or the user may design his or her own parameterized modules (e.g., using aspects of this invention). In the "Parameters" statement of FIG. 1a the user has specified "global" values of A0 and B0 for parameters X and Y, respectively. On the other hand, no global value has been specified for parameter Z.

Figure 1C:
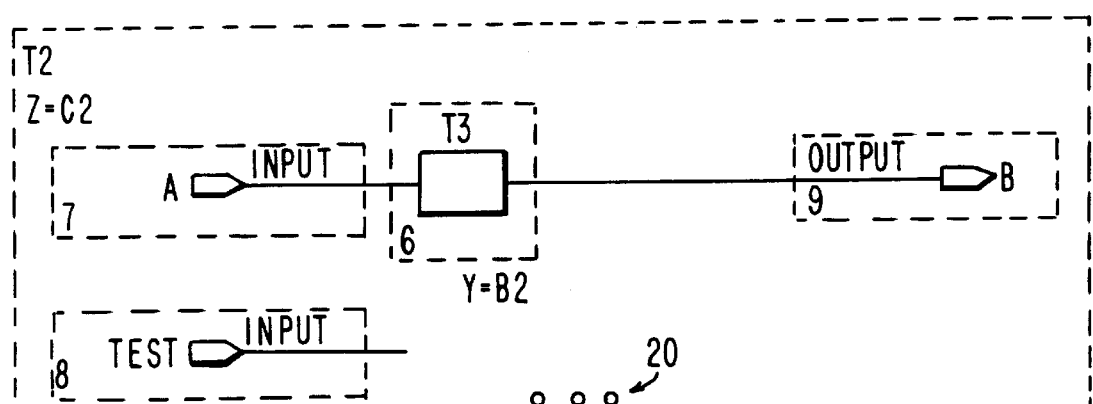
Figure 1D:
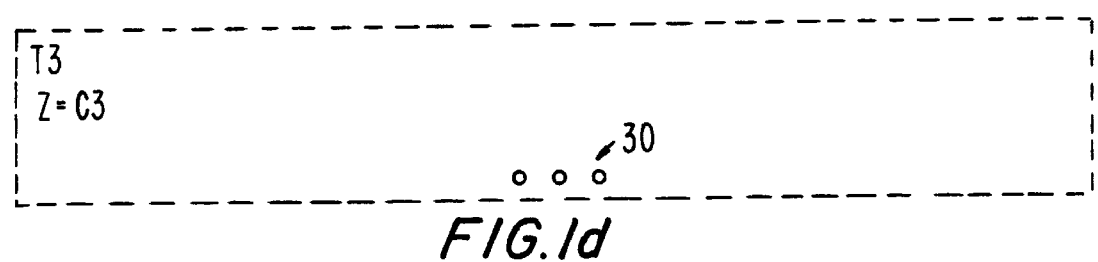

Following the parameters specification shown in FIG. 1a, the user has specified the actual logic of the design (partly in parameterized terms) in FIGS. 1b–1d. The highest level in the design hierarchy is shown in FIG. 1b. As shown there, top level logic module or macrofunction T1 uses inputs A and TEST and two instances of logic module or macrofunction T2 to produce output B. (The phrase "logic module" is frequently used herein to refer to a portion of the user's logic design. This use of this phrase should not be confused with other references herein to hardware "logic modules", i.e., portions of a programmable logic array device. The term "macrofunction" is sometimes used herein as a synonym for "logic module" in the context of a portion of the user's logic design, especially when that logic design portion is larger than an elemental unit (e.g., a simple gate or flip-flop) in a "compiler netlist file", as that concept is explained below.)

Logic module or macrofunction T2 is shown in FIG. 1c. It uses input A, optional input TEST, and one instance of logic module or macrofunction T3 to produce output B.

Logic module or macrofunction T3 is shown in FIG. 1d. The only function it is shown performing is providing a "default" value C3 for parameter Z.

FIGS. 1a–1d show examples of the various ways that parameters can be specified in accordance with this invention, but they do not show any actual use of any parameter. Nevertheless, it will generally be assumed herein that each of modules T1, T2, and T3 includes logic (in addition to that shown in detail in FIGS. 1b–1d) which uses parameters X and Y, and that this additional logic in each of modules T2 and T3 also uses parameter Z. This additional logic is represented by dots 10, 20, and 30 in FIGS. 1b, 1c, and 1d, respectively. At various points throughout this discussion explanation will be provided regarding cases in which a module does not use one or more parameters.

Although FIGS. 1a–1d show the use of a logic design graphic editor to specify a desired logic design, it will be understood that the user could alternatively specify the logic design in other ways, such as by using a logic design text language like AHDL, mentioned above. (See FIG. 6, which illustrates use of such a language.)

FIGS. 1a–1d show use of various types of references to parameters X, Y, and Z throughout the user's logic design. For example, the "global" parameter settings X=A0, Y=B0, and Z=unspecified in the "Parameters" statement (FIG. 1a) have already been mentioned. In the specification for T1 shown in FIG. 1b a "sub-global" value A1 is assigned to parameter X for the left-hand instance of module T2, and a "sub-global" value C1 is assigned to parameter Z for the right-hand instance of module T2. Similarly, in the specification of T2 in FIG. 1c a "default" value C2 is assigned to parameter Z, while a "sub-global" value B2 is assigned to parameter Y for the depicted instance of module T3. It has already been mentioned that FIG. 1d shows that module T3 is specified with a default value of C3 for parameter Z. These examples illustrate the point that, in accordance with this invention, it is not necessary for the user to specify a value for each parameter at each possible use of that parameter. Instead, parameter values that are specified at selected points in the design are automatically used at appropriate other points in the design in accordance with various rules for parameter value "inheritance", which will now be explained.

Although other parameter value inheritance rules could be established and followed, in the illustrative embodiment which is being described a "global" parameter value (if any) is passed down through the hierarchy of the user's logic design until a different "sub-global" parameter value setting (if any) is encountered. Then that sub-global value is passed down through the remainder of the hierarchy until a different further "sub-global" parameter value setting (if any) is encountered, and so on. A "default" value (if any) is used only when there is no other value specified for a parameter at the default value level or higher in the user's logic design hierarchy. A default value is used only in the logic module in which it is specified. Thus, a default value is not inherited by other logic modules.

Figure 2:
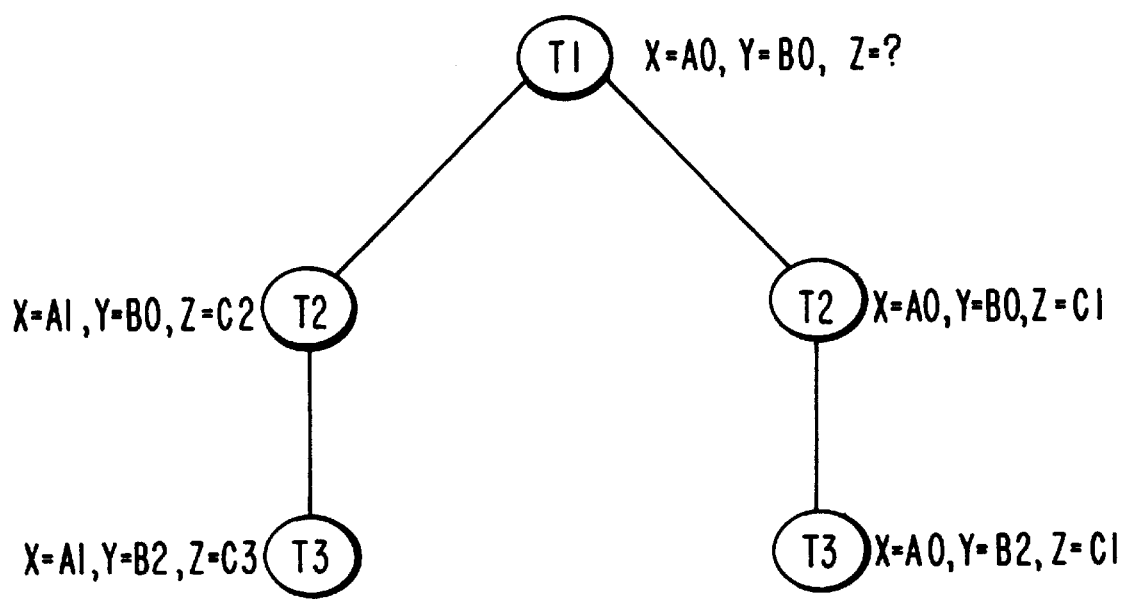
FIG. 2 is a simplified depiction of the "hierarchy" of the user's logic design shown in FIGS. 1a–1d.

To illustrate the foregoing parameter value inheritance rules, FIG. 2 is a very simple diagram of the hierarchy of the user's logic design of FIGS. 1a–1d with annotations to show the parameter values that are used in each instance of each logic module in that design. In top level logic module T1 the global values X=A0 and Y=B0 are used, and Z remains unspecified. In the left-hand instance of T2 the sub-global value X=A1 specified in connection with that T2 instance in T1 replaces the global value for X. However, because no sub-global value has been given for Y, the global value Y=B0 continues to be used. And because no other value has been specified for Z, the default value Z=C2 is used. In the left-hand instance of T3 the sub-global value X=A1 is inherited from above and used again. However, the sub-global value Y=B2 specified in connection with the instance of T3 in T2 replaces the global value Y=B0. Finally, the default value Z=C3 is used because no other value (other than another default value) has been specified for Z.

In the right-hand instance of T2 as shown in FIG. 2 the global values X=A0 and Y=B0 are inherited from above, and the sub-global value Z=C1, which is specified in connection with the right-hand instance of T2 in T1, is also used (so that the default value Z=C2 in T2 does not have to be used). Lastly, in the right-hand instance of T3 in FIG. 2 the global value X=A0 continues to be inherited from above, the sub-global value Y=B2 (which is specified in connection with the instance of T3 in T2) replaces the global value of Y, and the sub-global value Z=C1 continues to be inherited from above (so that the default value Z=C3 in T3 does not have to be used).

It will be apparent that the use of parameters as described above has a number of advantages. Because parameter values can be inherited from logic module to logic module in a design hierarchy, it is not necessary to keep re-specifying their values every time they are used. This reduces the amount of data that the user must enter for a logic design. Another advantage is that if a design changes in respects that are parameterized, it is only necessary for the user to change the parameter values at their relatively few appearances in the design. Still another advantage of selective parameter inheritance in accordance with this invention is that it facilitates the design of recursive logic, i.e., logic in which a logic module uses one or more instances of itself. This last point is discussed in more detail in a later portion of this specification.

It should be noted that a logic module does not itself have to make use of a parameter or parameter value in order to accept a specification for that parameter or to pass a parameter value on to logic modules below it in the hierarchy of the user's logic design. For example, contrary to the assumption stated earlier, parameter Z may not actually be used until logic module T3 is reached. But various values can be specified for parameter Z at other points in the logic design hierarchy and passed down through that hierarchy from module to module until needed in instances of module T3.

Figure 3:
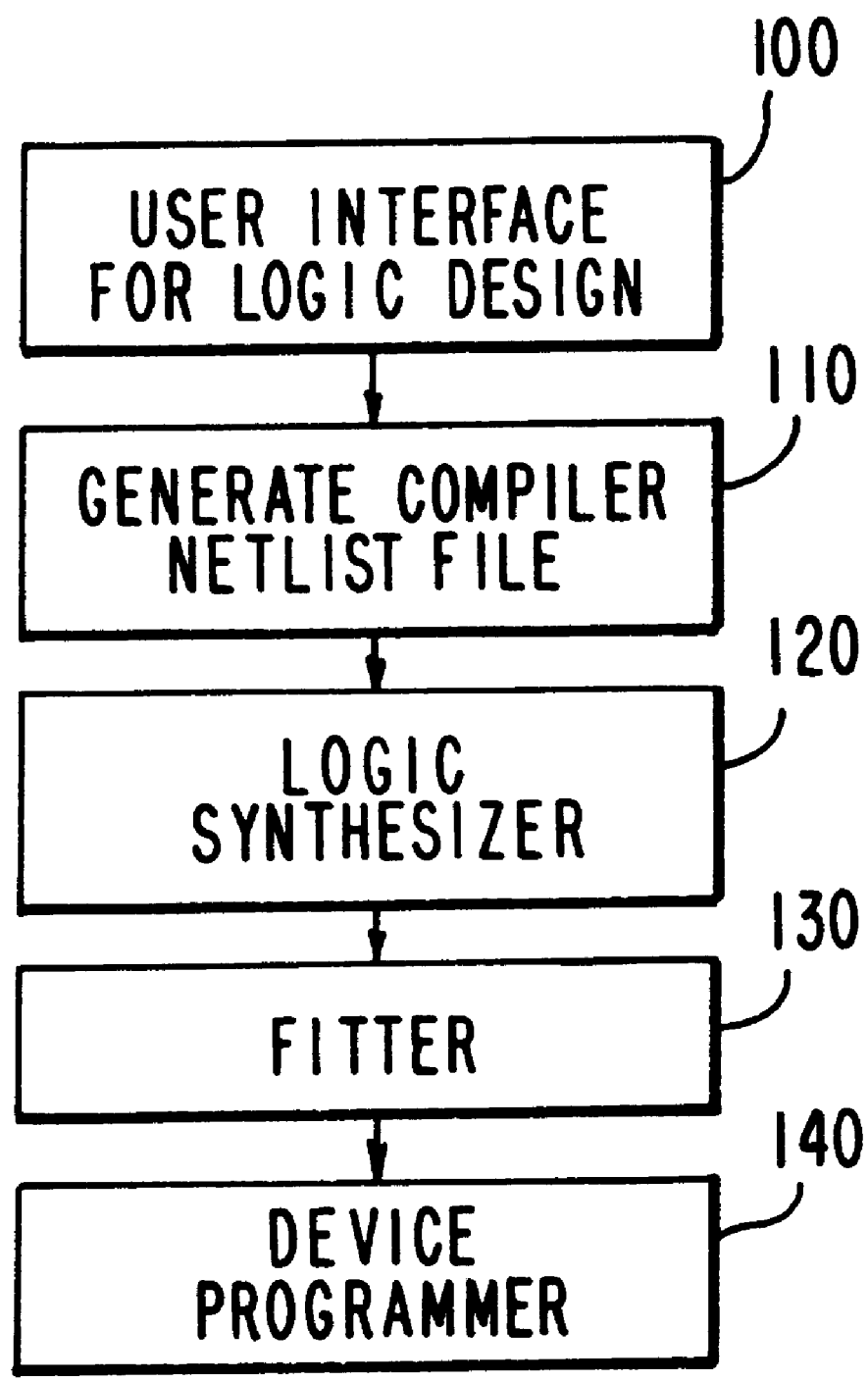
FIG. 3 is a simplified flow chart showing an overview of illustrative steps for specifying a logic design and ultimately implementing that design in a programmable logic array device.

We next consider an illustrative embodiment for processing a user's logic design (e.g., as shown in FIGS. 1a–1d) in order to implement that design in a programmable logic array device. An overview of this process is shown in FIG. 3. For completeness and generality FIG. 3 includes in step 100 the user logic design phase, which has been illustrated in FIGS. 1a–1d and discussed above. In step 110 the user's logic design from step 100 is processed to produce a "compiler netlist file" or "CNF" that identifies all the gates, flip-flops, and pins, as well as all the connections among these elements, that are required to implement the user's design. In step 120 a logic synthesizer portion of the software assembles the CNF data into modules of the type that can be implemented by programmable logic array devices of the type to be used. Then in step 130 a fitter portion of the software may be used to assign the synthesized logic modules to particular portions of the logic device. Finally, in step 140 a programmer portion of the software may be used to actually program the logic device as specified by the fitter.

At the relatively high level shown in FIG. 3, the logic design and implementation process can be conventional. For example, the above-mentioned MAX+PLUS II system performs steps of the type shown in FIG. 3. (For more information see, for example, Section 2, pp. 39–111 of the above-mentioned "MAX+PLUS II Getting Started" publication.) Only steps 100 and 110 need to be somewhat modified to implement this invention. Examples of suitable modifications to step 100 (e.g., the "Parameters" statement of FIG. 1a and the various techniques for specifying parameter values shown throughout FIGS. 1a–1d) have already been shown and described. Examples of suitable modifications to step 110 will now be discussed with reference to FIGS. 4 and 5a–5k.

Figure 4A:
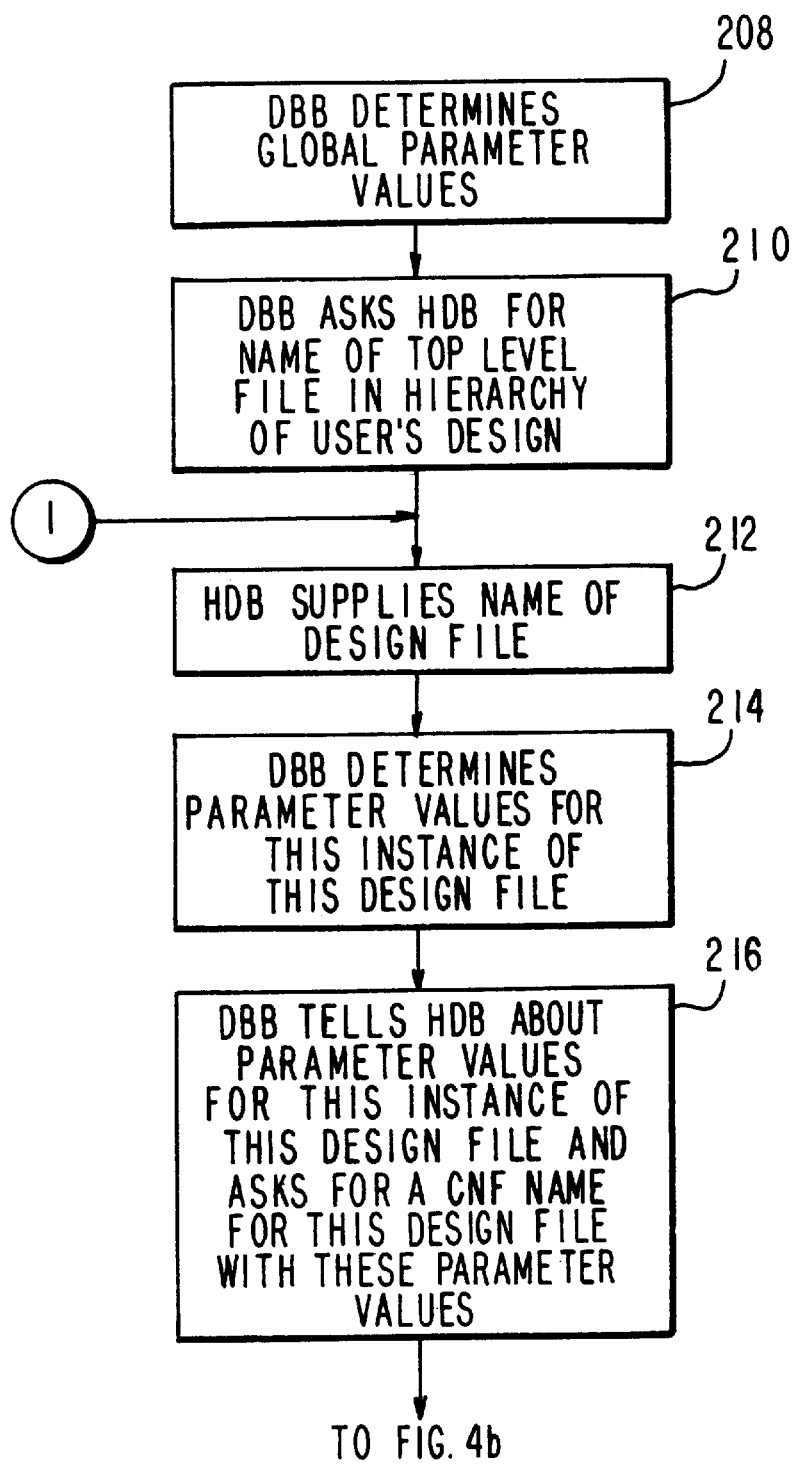
FIGS. 4a–4c, generally referred to collectively as FIG. 4, are a simplified flow chart of an illustrative embodiment of a portion of the processing of the information for a user's logic design in accordance with this invention.
Figure 4B:
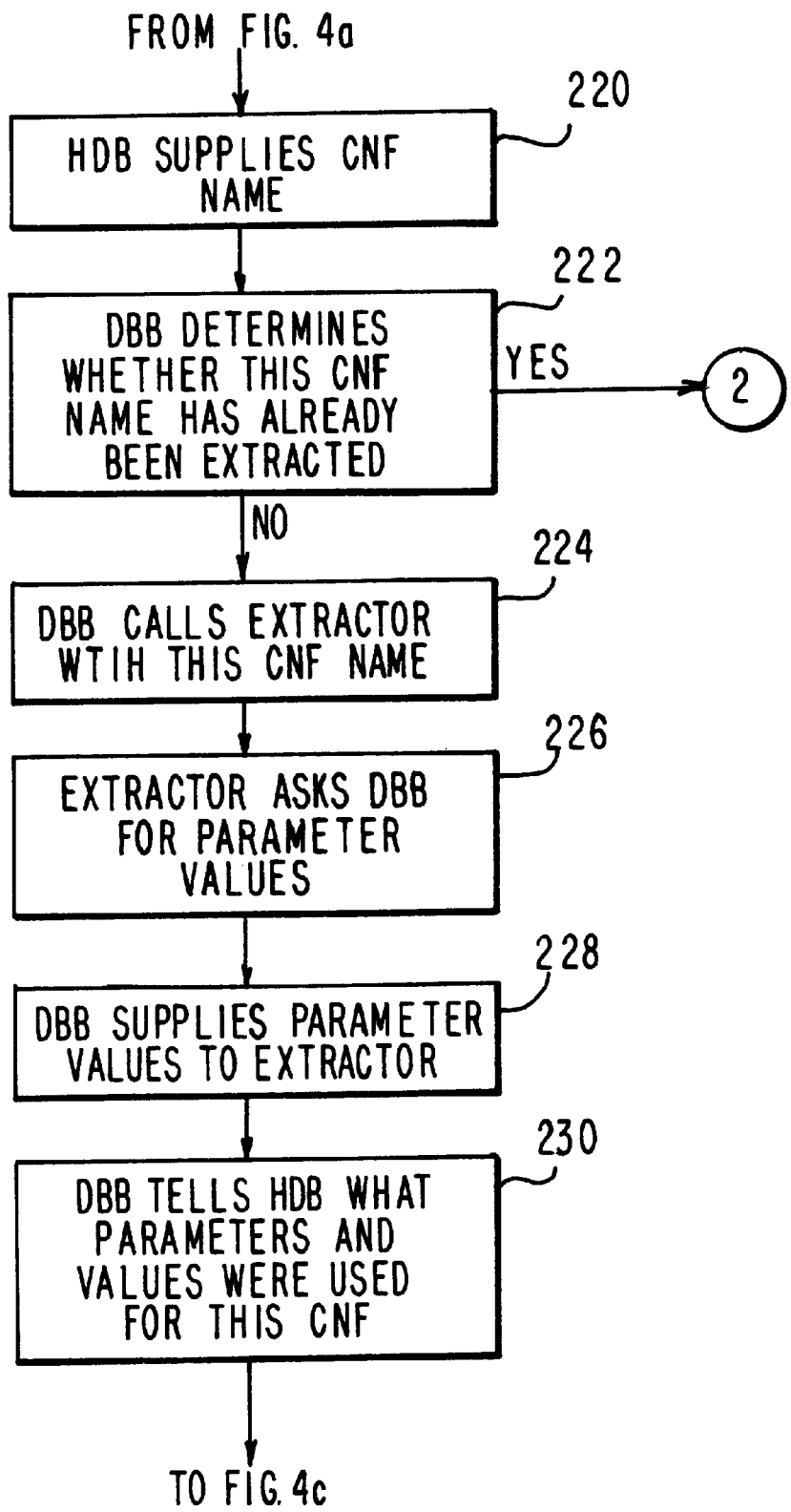
Figure 4C:
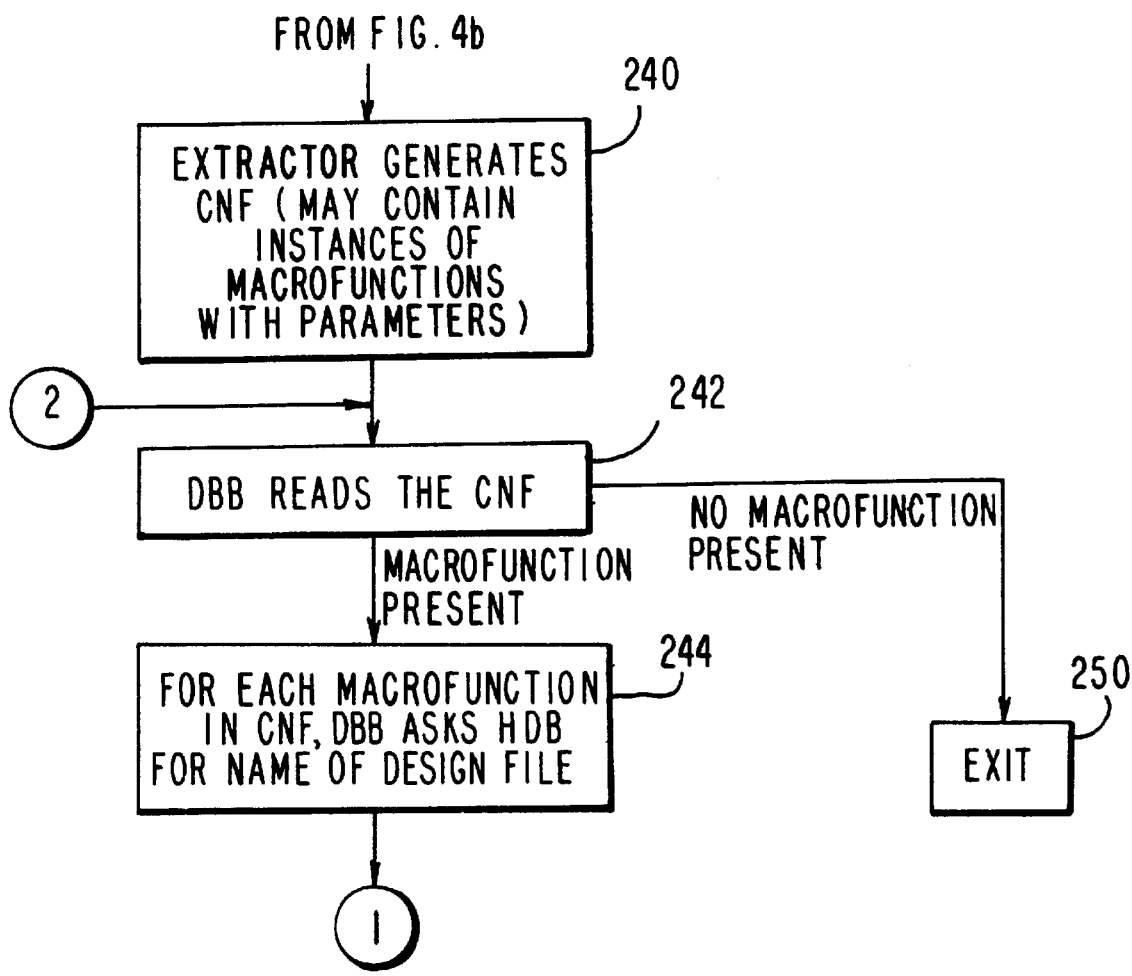

FIG. 4 refers to several modules in the MAX+PLUS II software and shows illustrative functions that may be added to those modules to implement this invention. For example, the MAX+PLUS II software has a project or file manager module "HDB" (for "hierarchy data base") which stores data (from step 100) about the overall hierarchy of the user's logic design. The HDB module can also get other information about the user's design from other MAX+PLUS II modules such as "GDF" (for "graphic data file"), "TDF" (for "text data file"), and/or other user interface modules, but it will be sufficient for present purposes to assume that all of this information comes from HDB. The MAX+PLUS II software also has a "database builder" module or "DBB" which controls the building of the CNF data for the user's design. The "compiler netlist file" or "CNF" module is another portion of the MAX+PLUS II software, the purpose of which already has been discussed.

Figure 5A:
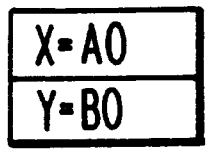
FIGS. 5a–5k are simplified representations of information about the user's logic design shown in FIGS. 1a–1d that is progressively built up as that design is processed in accordance with the steps shown in FIG. 4.

Turning now to the detailed steps shown in FIG. 4, in step 208 the DBB software module determines the global parameter values (if any) the user has specified as part of the logic design. This global parameter information may come from the HDB software module. The DBB module builds up a hierarchically linked list of the parameter specifications and logic modules so that it can determine the appropriate values of parameters to be used as each new logic module is added to this list. After performing step 208 the DBB linked list may be as shown in FIG. 5a for the user's logic design shown in FIGS. 1a–1d.

In step 210 the DBB software module asks the HDB software module for the name of the top level file in the hierarchy of the user's logic design. In the example shown in FIGS. 1a–1d this is T1. (As noted above, FIG. 2 shows the design of FIGS. 1a–1d in hierarchical fashion, making it clear that T1 is indeed the top level file in the hierarchy of the design.)

Figure 5B:
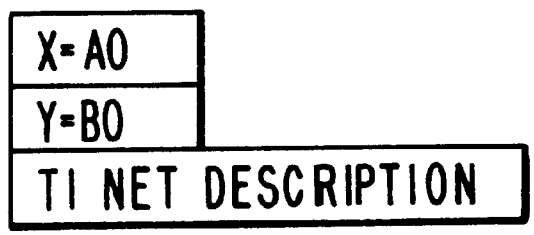

In step 212 HDB supplies the requested design file name to DBB. Also in step 212 HDB supplies any information that it has about which parameters are actually used in the named design file. If this is the first compilation of this design file, HDB will not know what parameters are used, and so it will not be able to supply any parameter identification information. But if this design file has already been compiled (e.g., in an earlier compilation of the user's design), HDB will have parameter identification information that it can and does supply to DBB in step 212. Except where specifically noted below, this discussion assumes that no part of the user's design shown in FIGS. 1a–1d has been previously compiled. Thus in this performance of step 212 HDB supplies the file name T1 but not an identification of the parameters used in T1. DBB adds to its linked list the available information for T1 as shown in FIG. 5b.

In step 214 DBB determines, for the parameter used in the design file that is currently being worked on (in this case T1), the values to be used for those parameters in this instance of this design file. This can be done by reviewing the linked list to the extent that it has thus far been built up as shown in FIG. 5b. If DBB knew that T1 used parameters X and Y, then working up from the T1 net description in FIG. 5b, DBB would determine the value of parameter X to be A0 and the value of parameter Y to be B0. (In FIG. 5c the FIG. 5b linked list is annotated with this parameter information.) However, if (as is generally assumed herein) T1 has not been previously compiled, DBB does not know at this stage what parameters T1 uses, and so step 214 has no parameter identifications to work on, and this step therefore produces no parameter value information.

In step 216 DBB tells HDB about the parameter values for this instance of this design file and asks for a CNF name for this design file with these parameter values. In the case being discussed, DBB will not be able to tell HDB about any parameter values in step 216. But if T1 had been previously compiled and DBB therefore knew that T1 uses parameters X and Y, DBB would be able to supply the values X=A0, Y=B0 in step 216.

In step 220 HDB supplies the requested CNF file name. For example, HDB may supply the name T1.CNF. Step 220 is preferably performed in such a way that whenever HDB is asked for a CNF name for a given file with the same parameters and parameter values, HDB responds with the same CNF file name. But HDB will respond with a different CNF file name if any parameter or parameter value is different. In this way DBB can determine (in step 222) whether it has previously seen (and therefore already extracted) each CNF file name it receives from HDB. If DBB finds that a CNF file name has already been extracted (and if an additional "date stamp" test described below is passed), the extraction process for that CNF file name is skipped by passing control to step 242, where processing starts again for another macrofunction. If extraction is thus skipped for a second or subsequent instance of a CNF file name that has already been extracted, DBB reinstantiates (i.e., duplicates) the extraction of that file in the CNF database it is building.

In step 222 DBB determines whether the CNF name it has received from HDB has already been extracted, i.e., whether a compiler netlist file has already been generated for this CNF name. Because it is being assumed that T1.CNF has not been previously extracted, control passes from step 222 to step 224. (Step 222 also preferably performs an additional test to determine whether the design file currently being worked on has a later time of creation than associated existing CNF data. If this "date stamp" information is later for the design file than for the CNF data, it is assumed that the CNF file name should be re-extracted because of possible changes to the design file since the previous extraction. Control is therefore passed from step 222 to step 224 in such a case, even if the CNF file name has already been extracted.)

In step 224 DBB calls the extractor software module, supplying the CNF name currently being worked on (i.e., T1.CNF). This causes the extractor module to begin the process of extracting the user's logic design module associated with the current CNF file name in order to produce a compiler netlist file for that logic module. (As has been mentioned, a compiler netlist file is a list of all the logic gates, flip-flops, and pins, together with all the connections between these elements, that are required to implement all or a portion of the user's logic design with particular parameter values. Until extraction of the user's entire logic design has been completed, however, the CNF for any portion of the user's logic may include as yet unextracted macrofunctions.)

If, in the course of extracting the current logic module, the extractor finds that it needs a value for a parameter used in that logic module, it performs step 226 to ask DBB for the parameter value to be used. In the specific case being considered the extractor will find that it needs values for parameters X and Y, and it will perform step 226 to ask DBB for those values.

Figure 5C:
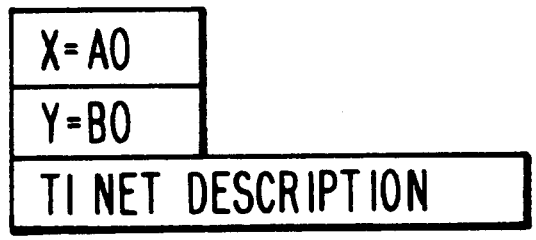

In step 228 DBB supplies the requested parameter values to the extractor. If DBB has not already determined these values as described above in connection with step 214, it now determines these values as in that way. In other words, DBB works its way up the relevant (i.e., hierarchically linked) portions of the linked list it is building as shown in FIG. 5c to find the values to be used for parameters X and Y. In this case DBB will find that the value to be used for X is A0 the value to be used for Y is B0. DBB therefore supplies the parameter values X=A0 and Y=B0 to the extractor.

In step 230, DBB tells HDB what parameters and values were used for this CNF. This allows HDB to supply the same CNF name in the future in the event that it is again asked (in step 216) about this same logic module with the same parameters and parameter values.

In step 240 the extractor software module generates the compiler netlist file for this CNF name (i.e, T1.CNF). To do this the extractor operates on the graphic data file ("GDF")

data for T1 (i.e., the GDF data for the user's design of T1 as shown in FIG. 1b) with the parameter value information provided to the extractor in step 228. The extractor thus generates the CNF for T1 that is appropriate for these parameter values. As has been mentioned above and as is again noted in step 240, the CNF generated in step 240 may include as yet unextracted logic macrofunctions (in this case two instances of as yet unextracted macrofunction T2).

Figure 5D:
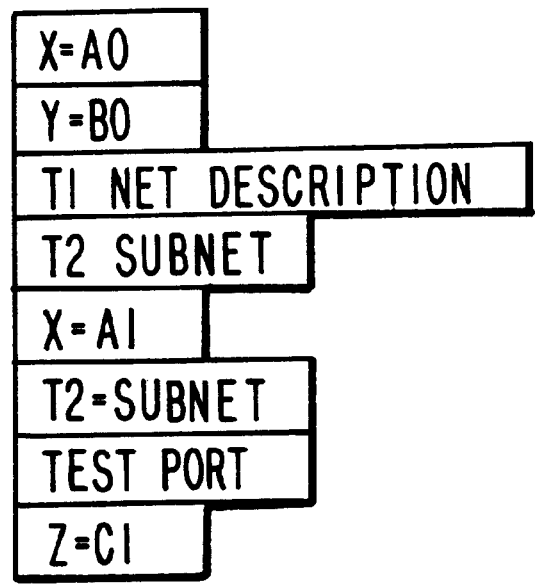

In step 242 DBB reads the CNF just extracted and adds data for that CNF to the linked list it is building as shown in FIG. 5d. In addition, DBB looks for as yet unextracted macrofunctions in the CNF data it has just read. In this case DBB will first find the first instance of T2.

In step 244 DBB asks HDB for the name of the macrofunction design file found in step 242. Step 244 is similar to step 210, except that it is more general (i.e., for possible as yet unextracted macrofunctions below the top level file). Control then returns to step 212.

Figure 5E:
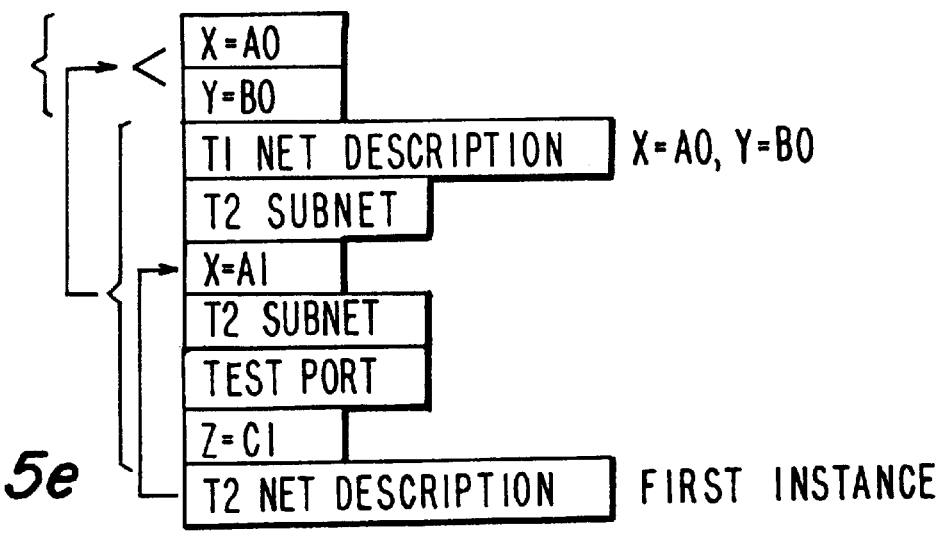
Figure 5F:
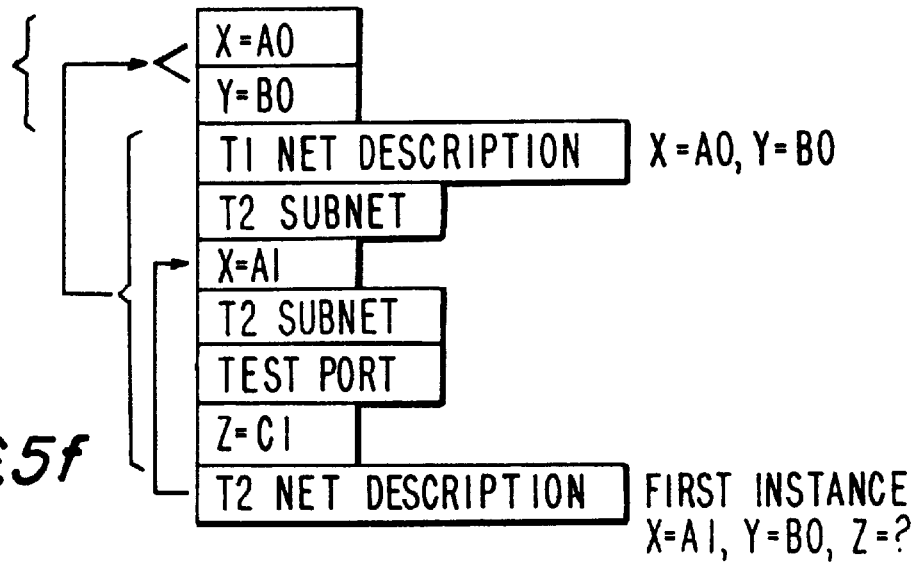

In this performance of step 212 HDB supplies the name T2. DBB then adds the information for the first instance of T2 to the linked list it is building as shown in FIG. 5e. Because this is assumed to be the first compilation of T2, HDB will not know what parameters (if any) are actually used in T2. Accordingly, at this stage the information DBB records about the first instance of T2 will not include any parameter identifying information. But if T2 had been previously compiled, HDB would also supply an identification of the parameters used by T2.

In the performance of step 214 which follows, DBB determines the parameter values for the first instance of T2. Again, DBB does this by reviewing the linked list (FIG. 5e) from the T2 net description upward in that list looking for values for the parameters that it knows are used in T2. In case being assumed, DBB does not at this point know what parameters T2 uses, and so step 214 will produce no parameter value information. But if DBB knew that T2 uses parameters X, Y, and Z, DBB would work its way up the portion of the linked list data for T1 which relates to the first instance of T2 looking for values for each of these parameters. In doing this DBB would find the sub-global parameter setting X=A1, which is part of the user's specification for the first instance of T2 in T1. DBB would take this as the value to be used for X, thereby causing DBB to ignore any other value for X set higher in the linked list. DBB would then continue up the linked list and find the global parameter settings X=A0 and Y=B0. DBB would ignore the setting X=A0 (because it would have already encountered the sub-global setting X=A1), but it would accept the setting Y=B0. Thus at the conclusion of its review of the relevantly linked portions of the linked list, DBB would have determined that the appropriate parameter values for the first instance of T2 are X=A1, Y=B0, and Z=unspecified. (In FIG. 5f the linked list of FIG. 5e is annotated with these parameter values.)

In the performance of step 216 which follows, DBB asks HDB for a CNF file name for the first instance of T2. If DBB knew the parameter values to be used for this instance of T2, DBB would supply that information to HDB so that HDB could take that information into account in supplying a CNF name for this first instance of T2. In the case being assumed, however, DBB does not have such parameter information, and so the portion of step 216 relating to parameters is not performed.

In step 220 HDB replies with an appropriate CNF file name (e.g., T2(1).CNF). T2(1).CNF has not yet been extracted, and so control passes from step 222 to step 224.

In step 224 DBB calls the extractor software modules with the CNF name T2(1).CNF.

In step 226 the extractor asks DBB for the parameter values associated with T2(1).CNF. In this case the extractor will ask DBB for values for parameters X, Y, and Z.

In step 228 DBB supplies the values X=A1, Y=B0, and Z=unspecified. DBB either knows these values from the immediately preceding performance of step 214, or it now performs operations like those described above in connection with step 214 to find these values in the linked list (FIG. 5f) it is building. Because DBB reports to the extractor that parameter Z is unspecified, the extractor knows that it should use the default value for Z provided in T2. The extractor will therefore use the value Z=C2 in the first instance of T2.

In step 230 DBB tells HDB what parameters and parameter values were used for this CNF.

In step 240 the extractor generates the CNF data for T2(1).CNF. Again, in this performance of step 240 the extractor uses the GDF data for T2 (as represented by FIG. 1c) but with the parameter values X=A1, Y=B0, and Z=C2 in order to produce the CNF data for the first instance of T2. The resulting CNF data will include an instance of macrofunction T3. Control then passes to step 242, where, as noted above, the process begins again for another macrofunction.

Figure 5G:
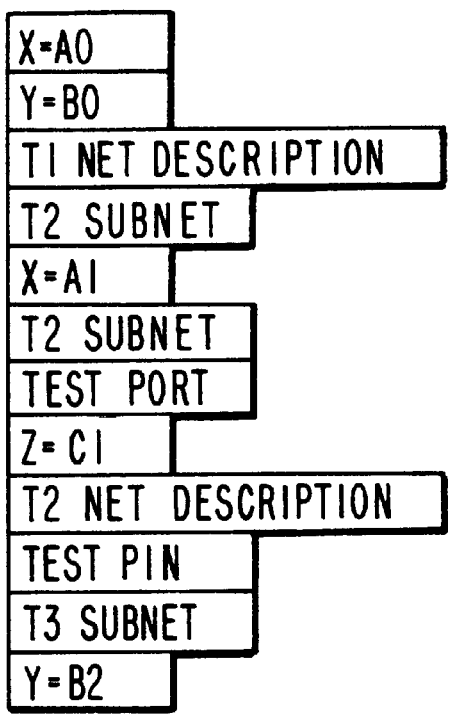
Figure 5H:
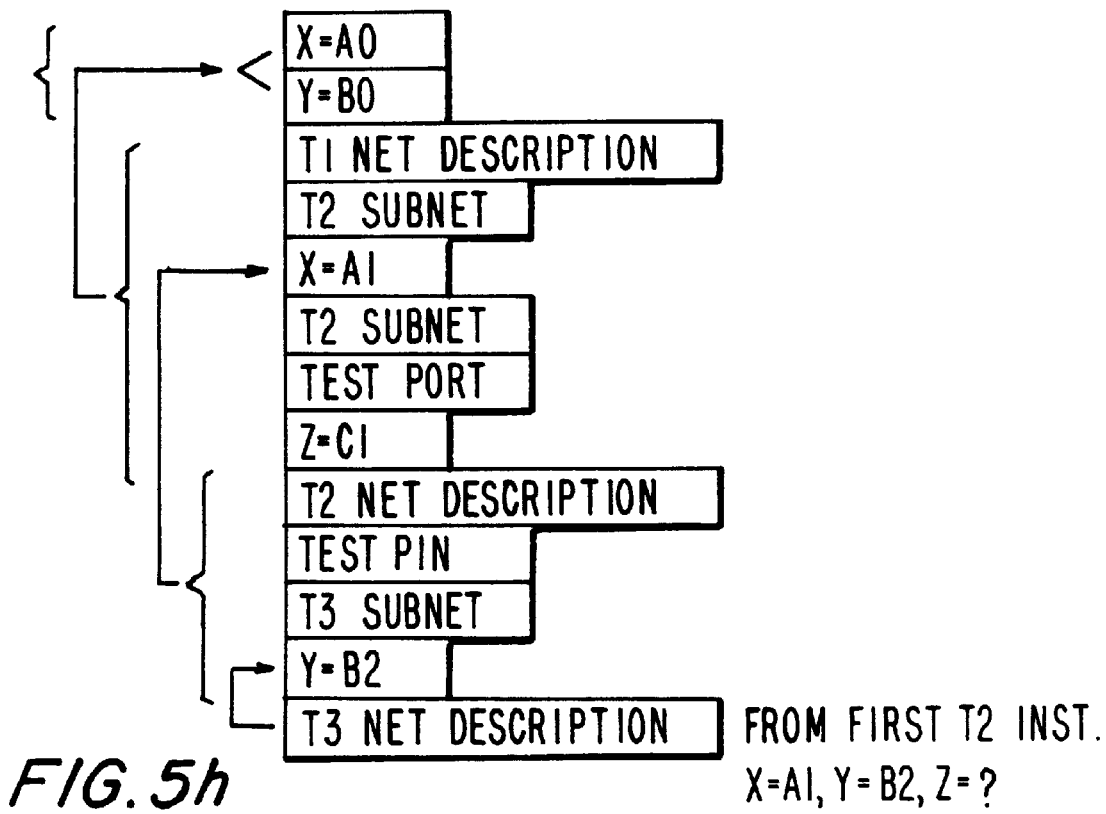

In the next performance of step 242 DBB adds to the linked list it is building data from CNF for the first instance of T2 as shown in FIG. 5g. DBB finds in this data as yet unextracted macrofunction T3. (In the embodiment being described, step 242 and other steps are performed so that the user's design hierarchy is processed in a "depth before width" order. Thus processing proceeds all the way to the bottom of the left-hand branch in FIG. 2 before going back up and starting down again (i.e., down the right-hand branch).) Step 244 is then performed for the instance of macrofunction T3 in the first instance of T2 (i.e., DBB asks HDB for the name of this macrofunction design file). Control then returns to step 212, where HDB supplies the name T3 and DBB therefore adds information for T3 to the linked list it is building as shown in FIG. 5h.

Step 214 is then performed again to determine the parameter values for this instance of T3. In the case being assumed, DBB does not at this point know what parameters are used by T3. Step 214 therefore cannot be performed. But if DBB did know that T3 uses parameters X, Y, and Z, step 214 would be performed as previously described. In particular, this would involve DBB reviewing its linked list, working up from its data for this instance of T3, but considering only the portions of the list that are hierarchically linked to this instance of T3. In the parameter settings which are part of the linked first instance of T2 DBB would find the sub-global setting of parameter Y equal to B2, which DBB would take as the value for parameter Y. DBB would ignore the default setting Z=C2 because default values are used only in the extractor and are not supplied to DBB. This is consistent with the rule that default values are not inherited by other modules. As DBB would continue moving up its linked list as shown in FIG. 5h it would find the sub-global parameter setting X=A1, which DBB would take as the value for parameter X. Finally, DBB would reach the global parameter settings X=A0 and Y=B0, but DBB would ignore these values because X and Y would have already been set sub-globally. Thus at the conclusion of step 214 DBB would have determined that the parameter values for the instance of T3 that is currently being processed are X=A1, Y=B2, and Z=unspecified. (FIG. 5h is annotated with these values for reference.)

In step 216 DBB asks HDB for a corresponding CNF file name for this instance of T3. If DBB was able to supply parameter value information, HDB would take that information into account in assigning the CNF file name.

In step 220 HDB replies with an appropriate CNF name (e.g., T3(1).CNF).

In step 222 DBB determines whether this CNF file has already been extracted. In this case the result will be negative because this is the first time T3 has been encountered. Control therefore passes to step 224.

Steps 224, 226, 228, 230, and 240 are now performed again, basically as described above, but for T3(1).CNF. (In step 240 the extractor uses the default value Z=C3 because no other value has been supplied for Z.) The resulting CNF data is added to the CNF file that is being built up.

When steps 242 and 244 are next performed, there will be no more macrofunctions in the CNF data for the left branch of the user's logic design hierarchy as shown in FIG. 2. However, DBB will find the second instance of macrofunction T2 (in the right-hand branch of FIG. 2). Control will therefore return to step 212 to begin processing of the right-hand branch of the logic in FIG. 2.

Figure 5I:
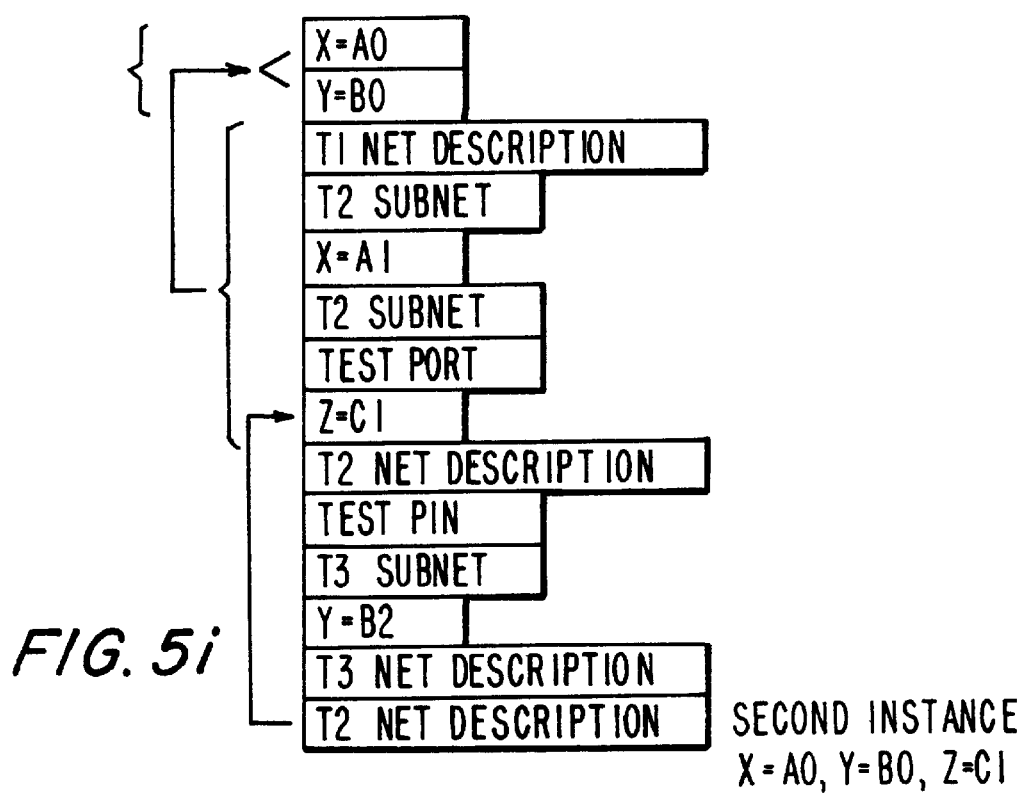

In step 212 HDB again supplies the name T2, and DBB therefore adds T2 data to the linked list it is building as shown in FIG. 5i. In this instance this data includes the information that T2 uses parameters X, Y, and Z. HDB is able to supply this parameter identifying information because T2 has been previously extracted and information about the parameters that it uses was supplied to HDB in the associated performance of step 230.

In step 214 DBB determines the values for parameters X, Y, and Z that are to be used for the second instance of T2. Again, this is done by working up through the hierarchically linked portions of the linked list shown in FIG. 5i. Moving up the linked list to the relevant (and therefore linked) portion of the data for T1, DBB finds the sub-global setting Z=C1. DBB therefore takes C1 as the value of Z. Continuing to move upward in the linked list, DBB finds the global setting X=A0 and Y=B0. No sub-global settings for these parameters having been previously found, DBB takes these values for X and Y. Thus at the end of step 214 DBB has determined the parameter values for this instance of T2 to be X=A0, Y=B0, and Z=C1. FIG. 5i is annotated with these values.

The CNF file name which results from performance of steps 216 and 220 may be something like T2(2).CNF. This is different from previously seen name T2(1).CNF (because two parameter values (X and Z) are different between the first and second instances of T2). The result of step 222 will therefore be negative. This leads to another performance of steps 224, 226, 228, 230, and 240, and therefore another extraction of T2, this time using parameter values X=A0, Y=B0, and Z=C1. The resulting CNF data for the second instance of T2 is added to the CNF file that is being built up.

Figure 5J:
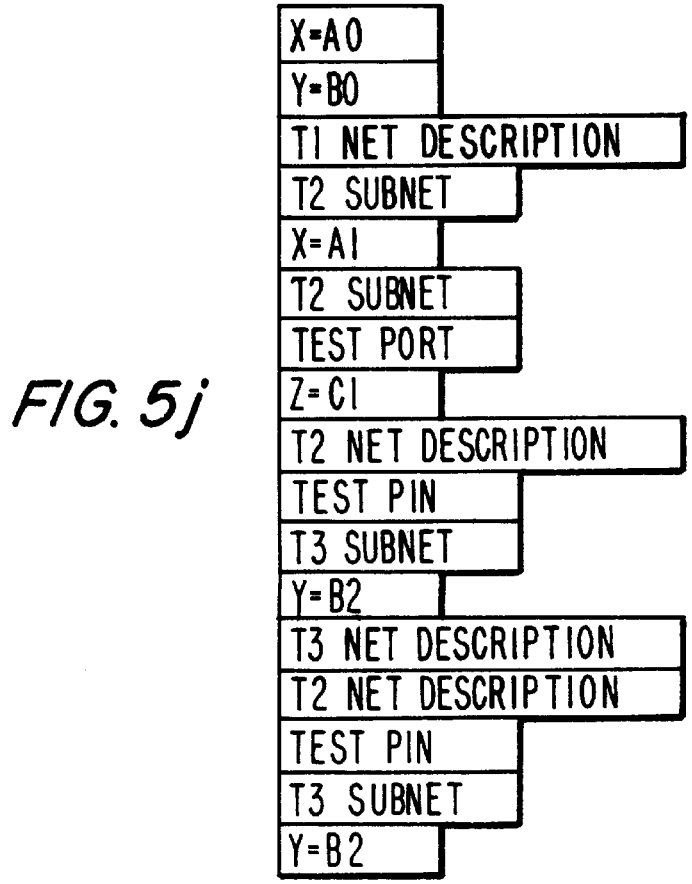
Figure 5K:
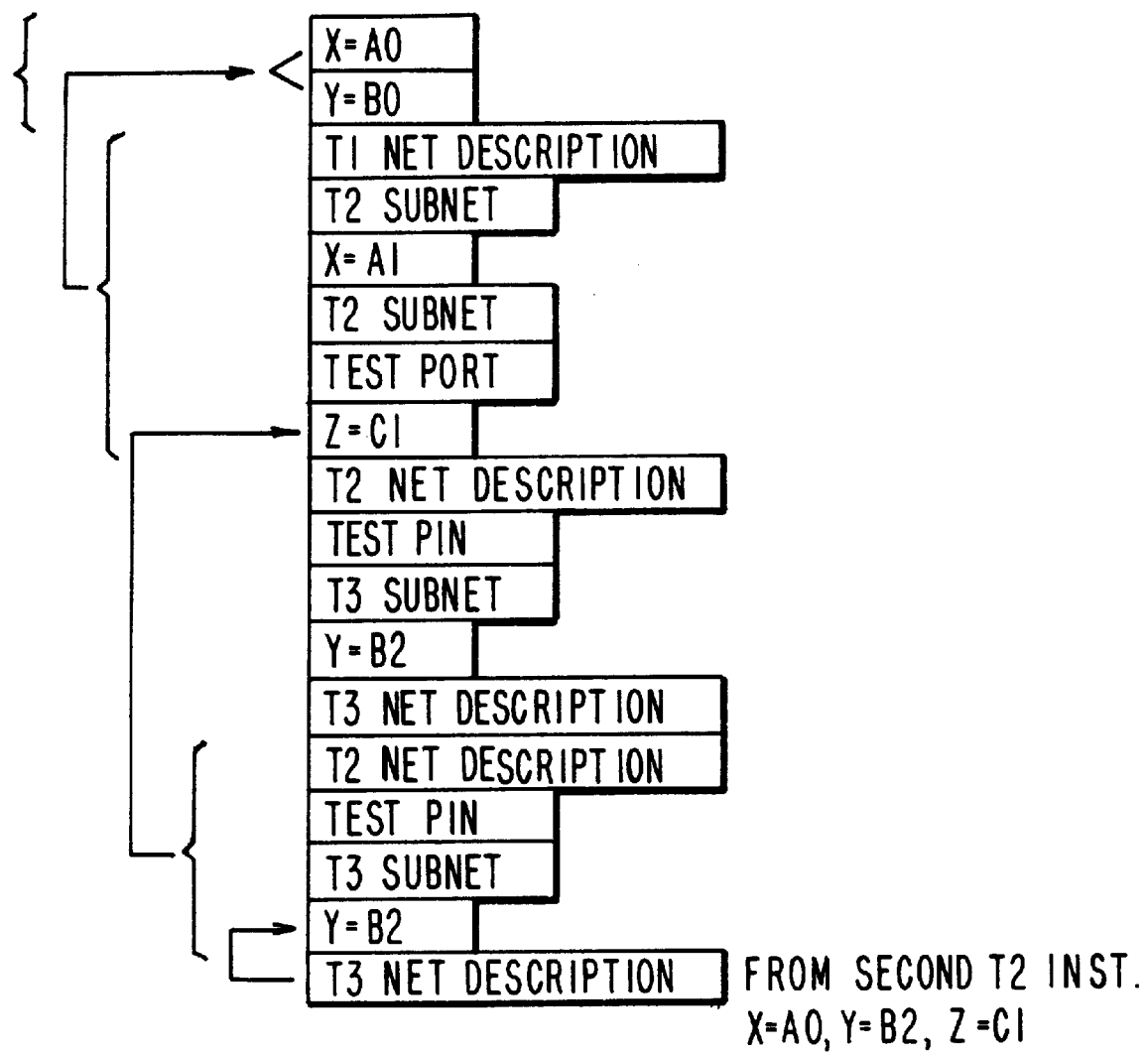

When step 242 is subsequently performed, more data from CNF is added to the linked list that DBB is building up as shown in FIG. 5j, and the macrofunction T3 is again found in this data. Step 244 is therefore performed again, and thereafter control again returns to step 212. This results in data for T3 being added a second time to the linked list DBB is building as shown in FIG. 5k. This time, however, this data can initially include the fact that T3 uses parameters X, Y, and Z. HDB knows this from the previous extraction of T3.

In step 214 DBB determines the values to be used for parameters X, Y, and Z in the second instance of T3 by again working up through the linked list (now as shown in FIG. 5k). Moving up the data for the linked second instance of T2 DBB finds the sub-global setting Y=B2. (The default setting Z=C2 in T2 is of course ignored as unknown to DBB.) Continuing up the linked FIG. 5k data DBB finds the sub-global setting Z=C1. Still farther up the linked FIG. 5k data DBB finds the global settings X=A0 and Y=B0. This global value for X is accepted, but the global value for Y is not accepted because Y has already been set sub-globally to equal B2. Accordingly, at the end of step 214 DBB has the values X=A0, Y=B2, and Z=C1 for the second instance of T3. (FIG. 5k is annotated with these values.)

Steps 216 and 220 result in a CNF file name like T3(2).CNF for the second instance of T3. This is a different CNF name than for the first instance of T3 because two parameter values (X and Z) are now different.

The result of step 222 is negative because T3(2).CNF has not already been extracted. Steps 224, 226, 228, 230, and 240 are therefore performed to extract T3(2).CNF and thereby add the CNF data for the second instance of T3 (with X=A0, Y=B2, and Z=C1) to the CNF file that is being built up.

When step 242 is next performed, DBB finds that there are no more macrofunctions in the CNF data. In other words, the user's design has now been fully extracted in the CNF (e.g., to the level of gates, flip-flops, pins, and interconnections). This phase of the implementation of the user's logic design is therefore complete, and exit step 250 is consequently performed.

Processing of the user's design can now be continued and completed (e.g., using conventional steps 120, 130, and 140 as shown in FIG. 3).

As has been mentioned, various features of this invention permit the user to design his or her own parameterized logic functions. The user is therefore not limited to only a predetermined set of parameterized modules such as the above-mentioned industry-standard LPM set. In addition, the invention permits the user to design recursive logic, i.e., logic in which a module uses instances of itself, albeit typically with different parameter values. An example which illustrates these features and advantages of the invention is shown in FIG. 6.

FIG. 6 shows a user's use of a text design interface (rather than a graphic design interface as is used in FIGS. 1a–1d) to design an AND gate in parameterized terms using a logic module which recursively instantiates itself. The name of this module is given as "Recursive_AND.TDF", where "TDF" indicates that the design is provided in a text data file. Although the AND gate may have any number of inputs, the "Parameters" statement is used to provide a default value of 8 for the WIDTH parameter. It will be appreciated from the earlier discussion of parameter value inheritance rules, however, that a different starting value of WIDTH may be provided by any logic which instantiates Recursive_AND.TDF.

In the design of Recursive_AND.TDF the module is specified as having a number of inputs given by the range WIDTH-1 . . . 0. For example, if WIDTH is 4, the module has inputs i[3], i[2], i[1], and i[0]. The module is also specified as having one output o.

The actual logic of the module is specified between the "Begin" and "End" statements. The first statement specifying this logic is the "If . . . Generate" statement. In this case this statement says that if the parameter WIDTH is given as 1, then output o is equal to input i[0]. Control thereafter passes to the "End Generate" statement, and then to the "End" statement. On the other hand, if the parameter WIDTH is not given as 1, then the "Else Generate" statement is performed. This statement specifies that output o is equal to i[0] AND Recursive_AND for inputs i[(WIDTH-1)] through i[1], with WIDTH equal to WIDTH-1. Thus in this Else Generate statement the Recursive_AND module instantiates itself, but with the sub-global parameter setting of WIDTH equal to the previous value of WIDTH minus 1. The specification of the Recursive_AND module is therefore recursive.

When the Recursive_AND logic module is processed (e.g., as described above in connection with FIG. 4), the module will typically first be instantiated with a WIDTH parameter value inherited from the logic higher in the user's logic design hierarchy that instantiates it. (If not, then the default value 8 will be used.) Assume, for example, that the inherited value of WIDTH is 3. Then the first instance of the Recursive_AND module will set output o equal to i[0] AND the result (or output o) of Recursive_AND of i[2 . . . 1], with parameter WIDTH set sub-globally to 2. This will result in a second instance of the Recursive_AND module in which output o is equal to i[0] AND the result (or output o) of Recursive_AND of i[1], with parameter WIDTH set sub-globally to 1. (In this last sentence i[0] is actually i[1] from the first instance of Recursive_AND because the portion of the first instance which calls the second instance shifts the starting point of the series of inputs up by one input. Similarly, i[1] in the last sentence before this parenthetical is actually i[2] from the first instance of Recursive_AND.) A third instance of the Recursive_AND therefore results in which output o is equal to i[0]. (In this last sentence i[0] is actually i[2] from the first instance of Recursive_AND because of two shifts of the inputs of the type described in the preceding parenthetical.)

Figure 7:
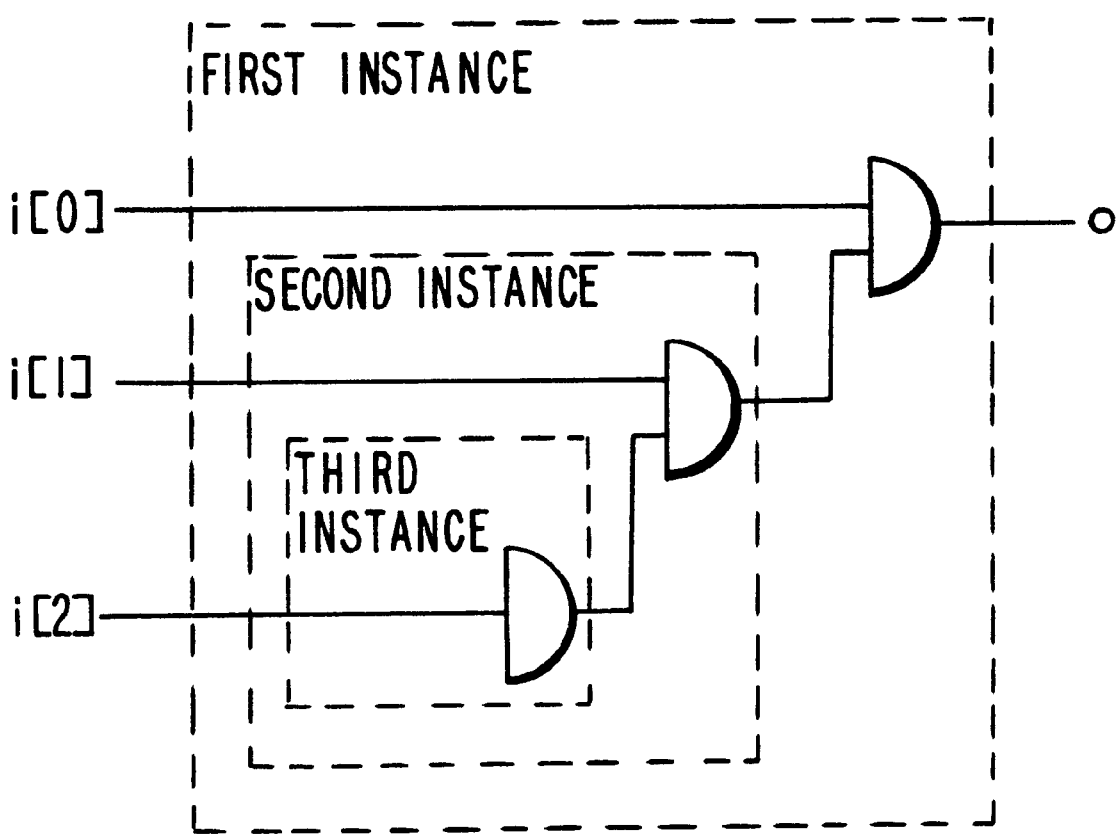
FIG. 7 is a block diagram showing the logic that results from the design of FIG. 6 for a particular starting value of the parameter used in that design.

Understanding of the foregoing example with WIDTH initially equal to 3 may be facilitated by considering the representation of the resulting logic which is shown in FIG. 7.

It will be apparent that the foregoing is only illustrative of the principles of the invention, and that various modifications can be made by those skilled in the art without departing from the scope and spirit of the invention. For example, FIG. 4 assumes that the software is modularized in a particular way. This is not necessary, however, and the software could alternatively be constructed quite differently (e.g., without discrete modules such as HDB and DBB). It is the functions which underlie the illustrative steps shown in FIG. 4 that are of greater importance than the details of the particular steps shown there. Similarly, the invention is not limited to the particular graphic or text interface formats illustrated in the drawings. Other formats or schemes can be used for entering parameter values and other information. Constructs alternative or additional to the "Parameters", "If . . . Generate", and "Else Generate" statements can be used to facilitate design of parameterized logic functions, including the use of recursion in such design.

The invention claimed is:

1. A machine method for implementing a logic design in a programmable logic array integrated circuit, said logic design including a plurality of logic modules that are logically interrelated in a logic hierarchy, said method comprising the steps of:

providing a generalized specification for at least one of said modules using a parameter for a logic characteristic of said module;

placing an instance of said at least one module at a point in said hierarchy;

specifying a value for said parameter in association with a point in said hierarchy which is remote from said instance; and converting the generalized specification of said at least one module to a specific implementation of said instance by identifying said value for said parameter which is specified in a portion of said hierarchy which uses said instance, and using said value to produce said specific implementation such that said specific implementation of said instance is copied from a previously converted instance, rather than converted from the generalized specification when said generalized specification is identical to the generalized specification corresponding to said previously converted instance.

2. The method defined in claim 1 wherein, in order to identify a value for said parameter, said converting step comprises the step of:

searching said hierarchy for a value for said parameter by working upward from said module through said hierarchy until a value for said parameter is found in logic which leads to said instance.

3. The method defined in claim 1 further comprising the steps of:

optionally associating a default value with said parameter in said generalized specification; and using said default value as the value for said parameter in said converting step in the event that a value is not otherwise identified in said converting step.

4. The method defined in claim 1 further comprising the steps of:

optionally associating a global value with said parameter; and using said global value as the value for said parameter in said converting step in the event that a value is not otherwise identified in said converting step.

5. The method defined in claim 1 wherein said specifying step comprises the step of:

entering plural different values for said parameter in association with respective plural different points in said hierarchy; and wherein said converting step identifies as the value for said parameter the first of said plural values which is encountered in working upward from said instance through said hierarchy of the logic which uses said instance.

6. The method defined in claim 1 wherein said step of providing a generalized specification for said at least one module includes the step of:

specifying that said at least one module recursively employs another instance of said at least one module.

7. The method defined in claim 6 wherein said step of specifying that said at least one module recursively employs another instance of said at least one module comprises the step of:

providing a different value of said parameter to be used in said another instance of said at least one module than is provided in said step of specifying a value for said parameter.

8. The method defined in claim 1 wherein said converting step comprises the steps of:

leaving the generalized specification of said at least one module available for use in a repetition of said converting step in the event that said at least one module is instantiated elsewhere in said hierarchy with a different value for said parameter.

9. A machine method for implementing a logic design in a programmable logic array integrated circuit comprising the steps of:

providing a generalized specification for a module of said logic design using a parameter for a logic characteristic of said module, said generalized specification including a recursive reference to said module such that said module optionally instantiates another instance of said module, with a provision that in said another instance said parameter is valued differently than in an instance of said module which employs said another instance; and specifying a value of said parameter to be used in said instance of said module which employs said another instance.

10. The method defined in claim 9 wherein said providing step comprises the step of:

specifying a logic function which is a part of said generalized specification for said module and which is in addition to the recursive inclusion in said generalized specification of said another instance of said module.

11. The method defined in claim 9 wherein said specifying step comprises the steps of:

optionally entering said value in association with a portion of said logic design which is remote from said instance of said module but which employs said instance of said module; and retrieving said value for use in connection with said instance of said module, when said instance of said module is to be implemented, by hierarchically searching upward through the logic which employs said instance of said module until said value is found.

12. The method defined in claim 11 wherein said specifying step further comprises the steps of:

optionally entering a global value for said parameter; and using said global value in connection with said instance of said module if said retrieving step does not retrieve a value for said parameter.

13. The method defined in claim 12 wherein said providing step further comprises the steps of:

optionally entering a default value for said parameter as part of said generalized specification; and using said default value in connection with said instance of said module if said retrieving step does not retrieve a value for said parameter and if no global value has been entered for said parameter.

14. A machine method for implementing a logic design in a programmable logic array integrated circuit comprising the steps of:

providing a generalized specification for a module of said logic design using a parameter for a logic characteristic of said module, an instance of said module being used by another portion of said logic design which is above said instance in a hierarchy of said logic design;

optionally entering a global value for said parameter;

optionally entering a sub-global value for said parameter in association with said another portion of said logic design;

selecting said sub-global value, if any, as the value of said parameter to be used when implementing said instance, and if there is no such sub-global value, then selecting said global value, if any, as the value of said parameter to be used when implementing said instance; and implementing said logic design in said programmable logic array integrated circuit using for said parameter in said instance the value selected in said selecting step.

15. The method defined in claim 14 further comprising the step of:

optionally including a default value for said parameter as part of said generalized specification; and wherein said selecting step further comprises the step of:

selecting said default value as the value of said parameter to be used when implementing said instance if there is no sub-global value and no global value.

16. The method defined in claim 14 wherein said step of optionally entering a sub-global value for said parameter optionally includes the step of:

entering plural sub-global values for said parameter, each of said sub-global values being entered in association with a respective one of a plurality of points along said hierarchy of said logic design; and wherein said selecting step comprises the step of:

considering said hierarchy of said another portion of said logic design in reverse hierarchical order so that a sub-global value associated with a point along said hierarchy which is first reached in said considering is selected as the value of said parameter to be used in implementing said instance.

17. The method defined in claim 14 wherein said implementing step comprises the steps of:

reducing said logic design to a set of elementary logic components and component interconnections which are collectively logically equivalent to said logic design;

converting said set of elementary logic components and component interconnections to a set of logic hardware modules and hardware module interconnections which are collectively logically equivalent to said set of elementary logic components and component interconnections, said logic hardware modules and hardware module interconnections being of a type which exist in said programmable logic array integrated circuit; and programming said programmable logic array integrated circuit so that each of said logic hardware modules and hardware module interconnections is respectively implemented in a corresponding portion of said programmable logic array integrated circuit.

\* \* \* \* \*